US012658253B2

(12) United States Patent
Husain et al.

(10) Patent No.: US 12,658,253 B2
(45) Date of Patent: Jun. 16, 2026

(54) TECHNOLOGIES FOR DYNAMIC BIASING FOR MEMORY CELLS

(71) Applicant: Intel Corporation, Santa Clara, CA (US)

(72) Inventors: Yasir Mohsin Husain, Folsom, CA (US); Xuming Zhao, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 234 days.

(21) Appl. No.: 17/706,943

(22) Filed: Mar. 29, 2022

(65) Prior Publication Data

US 2023/0317154 A1      Oct. 5, 2023

(51) Int. Cl.
*G11C 13/00*      (2006.01)
*H10B 63/00*      (2023.01)
*H10N 70/00*      (2023.01)

(52) U.S. Cl.
CPC ...... *G11C 13/0028* (2013.01); *G11C 13/0004* (2013.01); *G11C 13/0038* (2013.01); *G11C 13/004* (2013.01); *G11C 13/0069* (2013.01); *H10B 63/84* (2023.02); *G11C 2013/0045* (2013.01); *H10N 70/826* (2023.02)

(58) Field of Classification Search
CPC ............ G11C 13/0028; G11C 13/0004; G11C 13/0038; G11C 13/004; G11C 13/0069; G11C 2013/0045; G11C 2213/71; G11C 2213/73; H10B 63/84; H10B 63/10; H10B 63/24; H10N 70/826
See application file for complete search history.

(56) References Cited

U.S. PATENT DOCUMENTS

| | | | |
|---|---|---|---|
| 4,389,713 | A | 6/1983 | Patel et al. |
| 7,773,409 | B2 | 8/2010 | Chen et al. |
| 9,405,409 | B1 | 8/2016 | Grivna et al. |
| 11,195,575 | B1 | 12/2021 | Patel et al. |
| 2006/0221679 | A1 | 10/2006 | Kang et al. |
| 2008/0130352 | A1 | 6/2008 | Scheuerlein |
| 2008/0219046 | A1 | 9/2008 | Chen et al. |
| 2009/0010047 | A1 | 1/2009 | Sheu et al. |
| 2014/0104922 | A1 | 4/2014 | Tiburzi et al. |
| 2016/0042788 | A1 | 2/2016 | Ahn et al. |

(Continued)

OTHER PUBLICATIONS

USPTO Non-Final OA for U.S. Appl. No. 17/550,330 entitled, Technologies for Dynamic Current Mirror Biasing for Memory Cells (20 pages).

(Continued)

*Primary Examiner* — Jerome Leboeuf
(74) *Attorney, Agent, or Firm* — Alliance IP, LLC

(57) ABSTRACT

In the illustrative embodiment, a source follower sets a voltage on a wordline of a memory cell. A bias voltage on the gate of the source follower can be temporarily increased in order to charge the wordline more quickly. In some embodiments, for a read operation, after a demarcation voltage has been applied to the memory cell for the memory cell to change its resistance if it is set, the bias voltage on the gate of the source follower is decreased in order to prevent the memory cell from changing its resistance while the current through the memory cell is being read. In some embodiments, a current mirror can be activated in order to bleed off charge from the wordline to lower the voltage more quickly.

16 Claims, 13 Drawing Sheets

(56) References Cited

U.S. PATENT DOCUMENTS

| | | | | |
|---|---|---|---|---|
| 2019/0035449 | A1* | 1/2019 | Saida | G06N 3/084 |
| 2020/0027505 | A1 | 1/2020 | Lee et al. | |
| 2021/0004174 | A1 | 1/2021 | Boniardi et al. | |
| 2021/0118502 | A1 | 4/2021 | Janjua et al. | |
| 2021/0407593 | A1* | 12/2021 | Park | G11C 13/004 |
| 2022/0246209 | A1* | 8/2022 | Lee | G11C 13/0004 |
| 2022/0286102 | A1 | 9/2022 | Tung et al. | |
| 2023/0259149 | A1* | 8/2023 | O'Toole | G05F 3/26 |
| | | | | 365/185.21 |
| 2023/0267981 | A1* | 8/2023 | Parkinson | H10N 50/10 |
| | | | | 365/158 |

OTHER PUBLICATIONS

U.S. Appl. No. 17/184,462, filed Feb. 24, 2021 entitled, Technologies for Controlling Current Through Memory Cells (59 pages).

U.S. Appl. No. 17/550,330, filed Dec. 14, 2021 entitled, Technologies for Dynamic Current Mirror Biasing for Memory Cells (42 pages).

Choi, Sukhwan, et al.; "Auto-Scaling Overdrive Method Using Adaptive Charge Amplification for PRAM Write Performance Enhancement," IEEE Transactions on Circuits and Systems; Nov. 2014; 10 pages.

Choi, Youngdon, et al.; "A 20nm 1.8b 8Gb PRAM with 40 MB/s Program Bandwidth," 2012 IEEE International Solid State Circuits Conference; Feb. 2012; 3 pages.

EPO; Extended European Search Report issued in EP Patent Application No. 22151354.2, dated Jun. 15, 2022; 11 pages.

USPTO Non-Final Office Action received in U.S. Appl. No. 17/184,462, dated Mar. 28, 2024, 9 pages.

EPO Communication Pursuant to Article 94(3) in EP Application Serial No. 22151354.2-1211 mailed on Jun. 13, 2025 (8 pages).

USPTO Non-Final OA for U.S. Appl. No. 17/550,330 entitled, Technologies for Dynamic Current Mirror Biasing for Memory Cells (13 pages).

* cited by examiner

116

900

1000

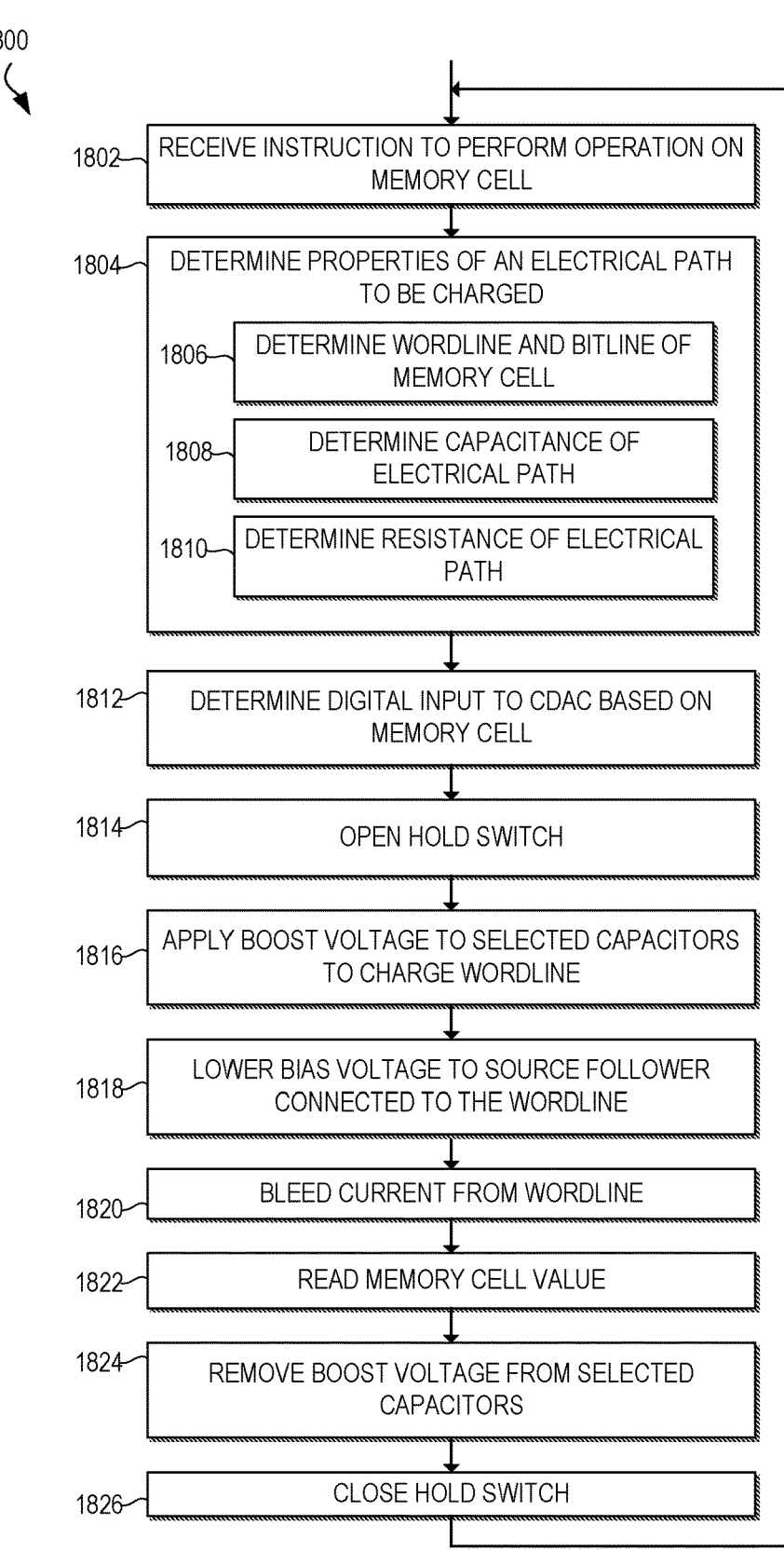

1800

1802 — RECEIVE INSTRUCTION TO PERFORM OPERATION ON MEMORY CELL

1804 — DETERMINE PROPERTIES OF AN ELECTRICAL PATH TO BE CHARGED

1806 — DETERMINE WORDLINE AND BITLINE OF MEMORY CELL

1808 — DETERMINE CAPACITANCE OF ELECTRICAL PATH

1810 — DETERMINE RESISTANCE OF ELECTRICAL PATH

1812 — DETERMINE DIGITAL INPUT TO CDAC BASED ON MEMORY CELL

1814 — OPEN HOLD SWITCH

1816 — APPLY BOOST VOLTAGE TO SELECTED CAPACITORS TO CHARGE WORDLINE

1818 — LOWER BIAS VOLTAGE TO SOURCE FOLLOWER CONNECTED TO THE WORDLINE

1820 — BLEED CURRENT FROM WORDLINE

1822 — READ MEMORY CELL VALUE

1824 — REMOVE BOOST VOLTAGE FROM SELECTED CAPACITORS

1826 — CLOSE HOLD SWITCH

FIG. 18

TECHNOLOGIES FOR DYNAMIC BIASING FOR MEMORY CELLS

BACKGROUND

In certain circuits such as phase-change memory cells, precise application of current can increase the operation of certain functions, such as reading the state of the memory cell. However, a circuit that requires a small amount of area and can quickly and precisely provide a desired amount of current can be challenging.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

FIG. 18 is a simplified flow diagram of at least one embodiment of a method for dynamic biasing of memory cells.

DETAILED DESCRIPTION OF THE DRAWINGS

Figure 1:
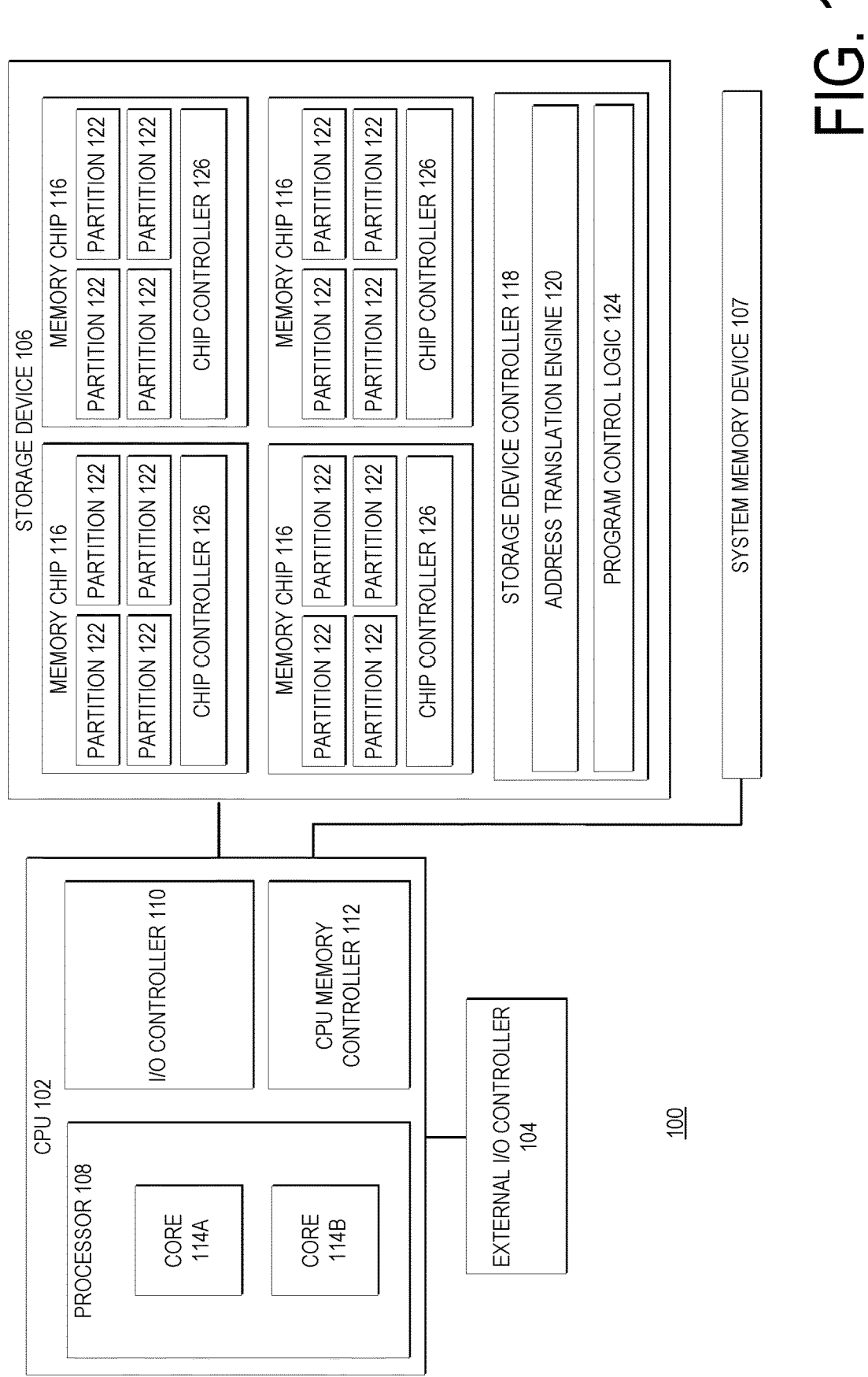
FIG. 1 illustrates components of a computer system in accordance with certain embodiments.

In the illustrative embodiment, a memory cell of a 3D crosspoint memory array can be read by applying a demarcation voltage across it and monitoring a current that passes through the memory cell. A voltage source such as a source follower may be used to provide the desired voltage. However, the source follower must pass enough current to charge up the wordline and/or bitline, and, as the source follower output voltage approaches the gate bias voltage, the current output reduces as well, leading to a relatively slow charging time that is susceptible to process variations. Additionally, in some cases, a memory cell may change state while a circuit is attempting to read the state of the memory cell, which can disrupt the circuit reading the state.

To address the limitations of a single source follower, in the illustrative embodiment, the gate bias voltage of the source follower is boosted when the source follower is initially charging up the wordline and/or bitline, increasing the rate at which the wordline and/or bitline is charged. After a predetermined time, the boost voltage is lowered, and the state of the memory cell can be read. Additionally or alternatively, in some embodiments, after the memory cell has had a demarcation voltage applied across for a predetermined period of time, the voltage across the memory cell is lowered, preventing the memory cell from potentially changing state during a read operation. A current mirror may be used to quickly bleed off some of the charge on the wordline and/or bitline to lower the time needed to reach the desired voltage.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

FIG. 1 illustrates components of a computer system 100 in accordance with certain embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices. In other embodiments, the I/O controller 110 may be on a different chip from the CPU 102. I/O devices may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a magnetic storage disk or optical storage disk controller; a wireless transceiver; a network processor; a network interface controller; or a controller for another input device such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http:// www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. Nonlimiting examples of nonvolatile memory may include any or a combination of: 3D crosspoint memory, phase change memory (e.g., memory that uses a chalco-genide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable program-mable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magne-toresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsys-tem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial speci-fication published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), origi-nally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or other-wise used by the cores 114A and 114B. In various embodi-ments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data.

The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a disk drive (e.g., a solid state drive); a memory card; a Universal Serial Bus (USB) drive; a Dual In-line Memory Module (DIMM), such as a Non-Volatile DIMM (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. In some embodiments, a system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
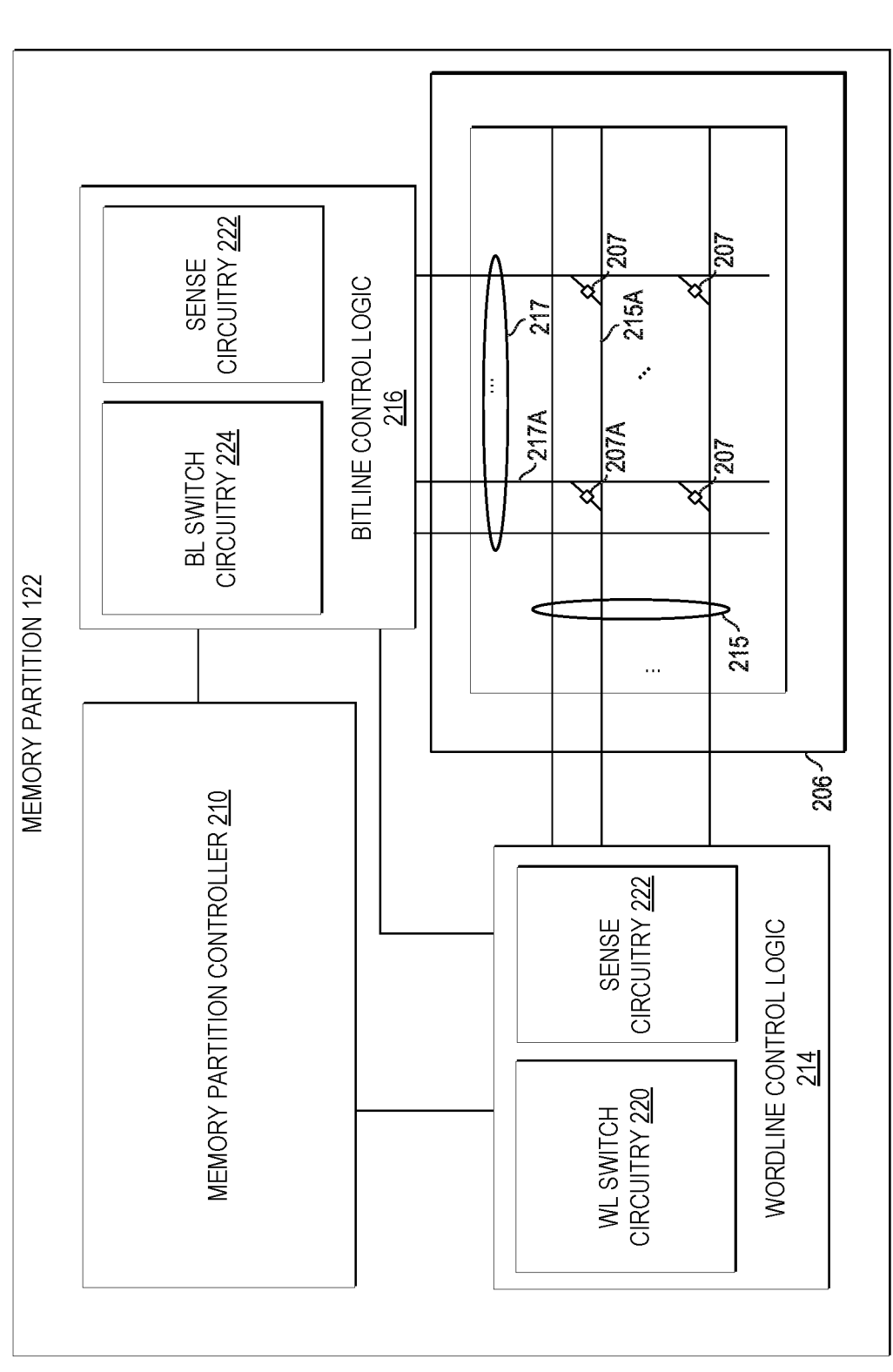
FIG. 2 illustrates a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called wordlines (WLs) and bitlines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a wordline may cross over a bitline located beneath the wordline and another bitline for another memory cell located above the wordline. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell.

FIG. 2 illustrates a memory partition in accordance with certain embodiments. In the embodiment of FIG. 2, a memory partition 122 includes memory partition controller 210, wordline control logic 214, bitline control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with wordline control logic 214 and bitline control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of wordlines 215, a plurality of bitlines 217 and a plurality of memory cells, e.g., memory cells 207. Each memory cell is coupled between a wordline ("WL") and a bitline ("BL") at a crosspoint of the WL and the BL. It should be appreciated that which line is the "wordline" and which line is the "bitline" is arbitrary, and the label "wordline" and "bitline" may be applied to, e.g., the line connected to either the higher or lower voltage.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage (e.g., a neutral bias voltage) to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage (e.g., a neutral bias voltage) to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current ($i_{cell}$) in the memory cell 207A dependent on a program state of the memory cell. A comparator such as a sense amplifier may compare $i_{cell}$ with a reference current in order to read a logic state of the memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, in one embodiment, 128 memory cells may be sensed at one time by sense amplifiers of the sense circuitry 222.

Figure 3:
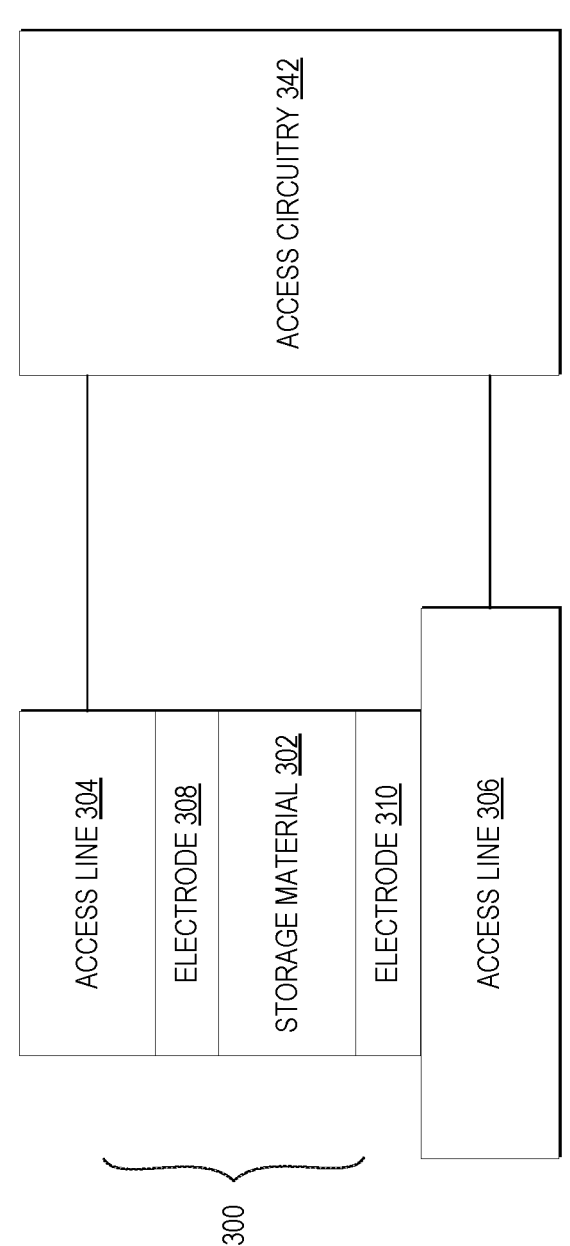
FIG. 3 illustrates a memory cell coupled to access circuitry in accordance with certain embodiments.
Figure 3:

FIG. 3 illustrates a memory cell 300 coupled to access circuitry 342 in accordance with certain embodiments. The memory cell 300 includes a storage material 302 between access lines 304 and 306. The access lines 304, 306 electrically couple the memory cell 300 with access circuitry 342 that writes to and reads the memory cell 300. For example, access circuitry 342 may include WL switch circuitry 220, BL switch circuitry 224, sense circuitry 222, or other suitable circuitry.

In one embodiment, storage material 302 includes a self-selecting material that exhibits memory effects. A self-selecting material is a material that enables selection of a memory cell in an array without requiring a separate selector element. Thus, storage material 302 may represent a "selector/storage material." A material exhibits memory effects if circuitry (e.g., 342) for accessing memory cells can cause the material to be in one of multiple states (e.g., via a write operation) and later determine the programmed state (e.g., via a read operation). Access circuitry 342 can store information in the memory cell 300 by causing the storage material 302 to be in a particular state. The storage material 302 can include, for example, a chalcogenide material or other material capable of functioning as both a storage element and a selector, to enable addressing a specific memory cell and determining what the state of the memory cell is. Thus, in one embodiment, the memory cell 300 is a self-selecting memory cell that includes a single layer of material that acts as both a selector element to select the memory cell and a memory element to store a logic state. In the embodiment depicted, each memory cell 300 is a two-terminal device (i.e., the memory cell 300 has two electrodes to receive control signals sufficient to write to and read from the memory cell 300).

In other embodiments, each memory cell (e.g., 300) includes a memory element configured to store information and a separate memory cell select device (e.g., selector) coupled to the memory element. Select devices may include ovonic threshold switches, diodes, bipolar junction transistors, field-effect transistors, etc. In one embodiment, a first chalcogenide layer may comprise the memory element and a second chalcogenide layer may comprise the select device.

The storage material 302 may include any suitable material programmable to a plurality of states. In some embodiments, the storage material 302 may include a chalcogenide material comprising a chemical compound with at least one chalcogen ion, that is, an element from group 16 of the periodic table. For example, the storage material 302 may include one or more of: sulfur (S), selenium (Se), or tellurium (Te). Additionally or alternatively, in various embodiments, storage material 302 may comprise germanium (Ge), antimony (Sb), bismuth (Bi), lead (Pb), tin (Sn), indium (In), silver (Ag), arsenic (As), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta), or other materials. In various examples, the storage material 302 may include one or more chalcogenide materials such as such as Te—Se, Ge—Te, In—Se, Sb—Te, Ta—Sb—Te, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, or Se—As—Ge—Si—In. In other various examples, storage material 302 may include other materials capable of being programmed to one of multiple states, such as Ge—Sb, Ga—Sb, In—Sb, Sn—Sb—Bi, or In—Sb—Ge. One or more elements in a chalcogenide material (or other material used as storage material 302) may be dopants. For example, the storage material 302 may include dopants such as: aluminum (Al), oxygen (O), nitrogen (N), silicon (Si), carbon (C), boron (B), zirconium (Zr), hafnium (Hf), or a combination thereof. In some embodiments, the chalcogenide material (or other material used as storage material 302) may include additional elements such as hydrogen (H), oxygen (O), nitrogen (N), chlorine (Cl), or fluorine (F), each in atomic or molecular forms. The storage material 302 may include other materials or dopants not explicitly listed. In some examples, the storage material (such as any of the materials described above) is a phase change material. In other examples, the storage material 302 is not a phase change material, e.g., can be in one or multiple stable states (or transition between stable states) without a change in phase.

In some embodiments, a selector element coupled to storage material (e.g., in non-self-selecting memory cells) may also include a chalcogenide material. A selector device having a chalcogenide material can sometimes be referred to as an Ovonic Threshold Switch (OTS). An OTS may include a chalcogenide composition including any one of the chalcogenide alloy systems described above for the storage element and may further include an element that can suppress crystallization, such as arsenic (As), nitrogen (N), or carbon (C), to name a few. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

In some embodiments, an element from column III of the periodic table ("Group III element") may be introduced into a chalcogenide material composition to limit the presence of another material (e.g., Ge) in the selector device. For example, a Group III element may replace some or all of the other material (e.g., Ge) in the composition of the selector device. In some embodiments, a Group III element may form a stable, Group III element-centered tetrahedral bond structure with other elements (e.g., Se, As, and/or Si). Incorporating a Group III element into the chalcogenide material composition may stabilize the selector device to allow for technology scaling and increased cross point technology development (e.g., three-dimensional cross point architectures, RAM deployments, storage deployments, or the like).

In one embodiment, each selector device comprises a chalcogenide material having a composition of Se, As, and at least one of B, Al, Ga, In, and Tl. In some cases, the composition of the chalcogenide material comprises Ge or Si, or both.

In one example, the storage material is capable of switching between two or more stable states without changing phase (in other examples the storage material may switch between two stable states by changing phase). In one such embodiment, the access circuitry 342 programs the memory cell 300 by applying one or more program pulses (e.g., voltage or current pulses) with a particular polarity to cause the storage material 302 to be in the desired stable state. In one embodiment, the access circuitry 342 applies program pulses to the access lines 304, 306 (which may correspond to a bitline and a wordline) to write to or read the memory cell 300. In one embodiment, to write to the memory cell 300, the access circuitry applies one or more program pulses with particular magnitudes, polarities, and pulse widths to the access lines 304, 306 to program the memory cell 300 to the desired stable state, which can both select memory cell 300 and program memory cell 300. In various embodiments below, programming states are depicted as being associated with a single programming pulse, however, the single programming pulse may also be equivalent to a series of programming pulses that have the effective characteristics of the single programming pulse (e.g., a width of the single programming pulse may be equivalent to the sum of the widths of a series of shorter programming pulses).

In one embodiment, programming the memory cell 300 causes the memory cell 300 to "threshold" or undergo a "threshold event." When a memory cell thresholds (e.g., during application of a program pulse), the memory cell undergoes a physical change that causes the memory cell to exhibit a certain threshold voltage in response to the application of a subsequent voltage (e.g., through application of a read pulse with a particular voltage magnitude and polarity). Programming the memory cell 300 can therefore involve applying a program pulse of a given polarity to induce a programming threshold event and application of current for a duration of time, which causes the memory cell 300 to exhibit a particular threshold voltage at a subsequent reading voltage of a same or different polarity. In one such embodiment, the storage material 302 is a self-selecting material that can be programmed by inducing a threshold event.

During a read operation, access circuitry 342 may determine a threshold voltage of a memory cell based on electrical responses to a read voltage applied to the memory cell. Detecting electrical responses can include, for example, detecting a voltage drop (e.g., a threshold voltage) across terminals of a given memory cell of the array or current through the given memory cell. In some cases, detecting a threshold voltage for a memory cell can include determining that the cell's threshold voltage is lower than or higher than a reference voltage, for example a read voltage. The access circuitry 342 can determine the logic state of the memory cell 300 based on the electrical response of the memory cell to the read voltage pulse.

As mentioned above, the access lines 304, 306 electrically couple the memory cell 300 with circuitry 342. The access lines 304, 306 can be referred to as a bitline and wordline, respectively. The wordline is for accessing a particular word in a memory array and the bitline is for accessing a particular bit in the word. The access lines 304, 306 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 308, 310 are disposed between storage material 302 and access lines 304, 306. Electrodes 308, 310 electrically couple access lines 304, 306 to storage material 302. Electrodes 308, 310 can be composed of one or more conductive and/or semiconductive materials such as, for example: carbon (C), carbon nitride ($C_xN_y$); n-doped polysilicon and p-doped polysilicon; metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive wordline layer can include any suitable metal including, for example, metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

The memory cell 300 is one example of a memory cell that may be used as a multi-level cell (storing more than a single logical bit). Other embodiments can include memory cells having additional or different layers of material than illustrated in FIG. 3 (e.g., a selection device between the access line 304 and the storage element, a thin dielectric material between the storage material and access lines, or other suitable configuration).

Figure 4:
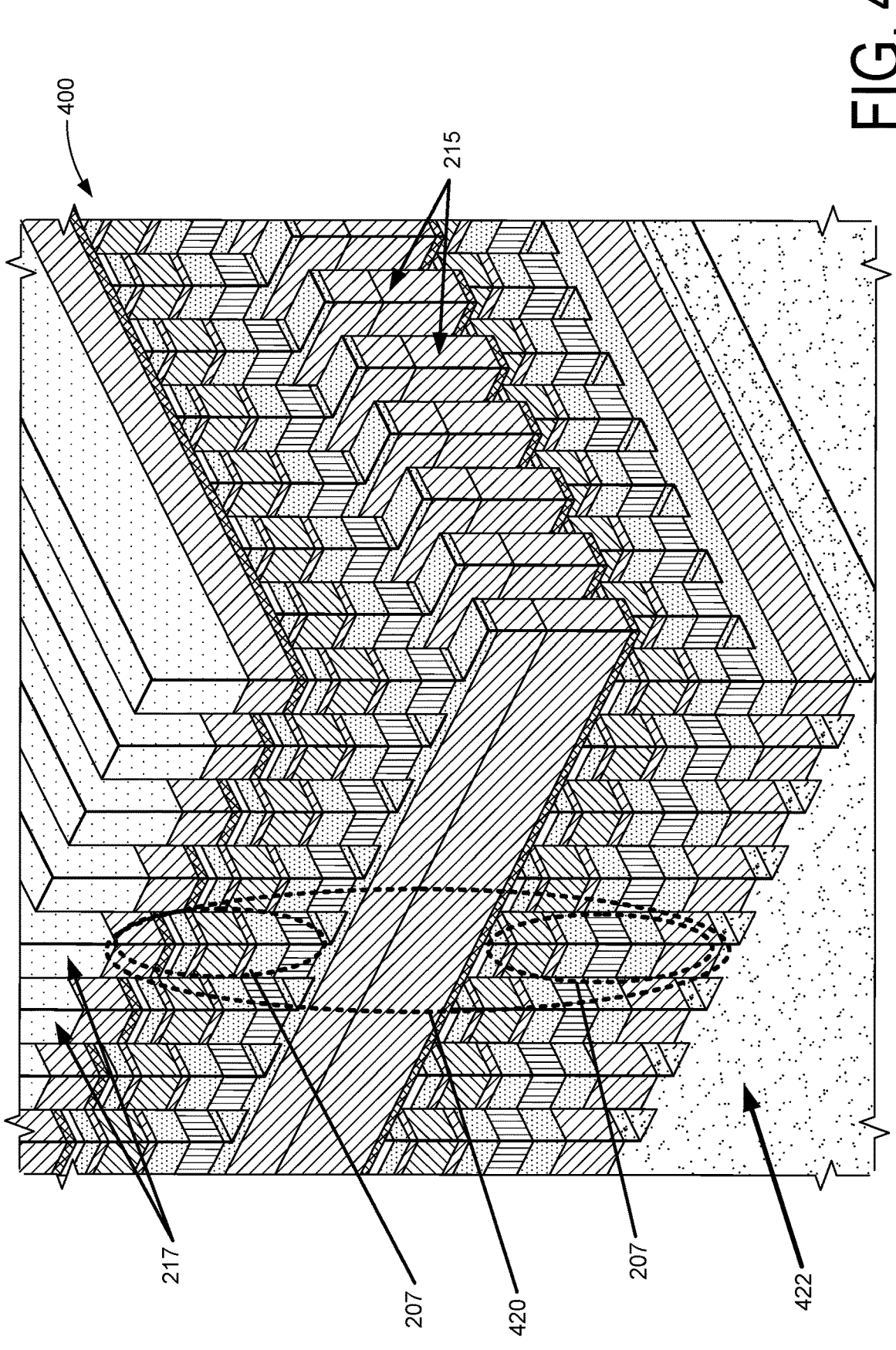
FIG. 4 is a perspective view of portions of a three-dimensional (3D) crosspoint memory stack according to one embodiment.

FIG. 4 is a perspective view of portions of a 3D crosspoint memory stack according to one embodiment. The specific layers are merely examples and will not be described in detail here. Stack 400 is built on substrate structure 422, such as silicon or other semiconductor. Stack 400 includes multiple pillars 420 as memory cell stacks of memory cells 207 or 300. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. Different architectures can use different numbers of stacks of devices, and different configuration of WLs and BLs. It will be understood that the space between pillars 420 is typically an insulator.

Substrate structure 422, such as a silicon substrate, may include control circuitry therein (not shown), such as control circuitry including transistors, row decoders, page buffers, etc. The control circuitry of substrate structure 422 may include, for example, a memory partition controller such as memory partition controller 210, BL control logic such as BL control logic 216, and WL control logic such as WL control logic 214 of FIG. 2, access circuitry 342, or other suitable control circuitry. Each row of WLs 215 extending in the Y direction, the corresponding cells as coupled to corresponding BLs, would define a memory array, and may correspond to a memory array such as memory array 206 of FIG. 2.

Figure 5:
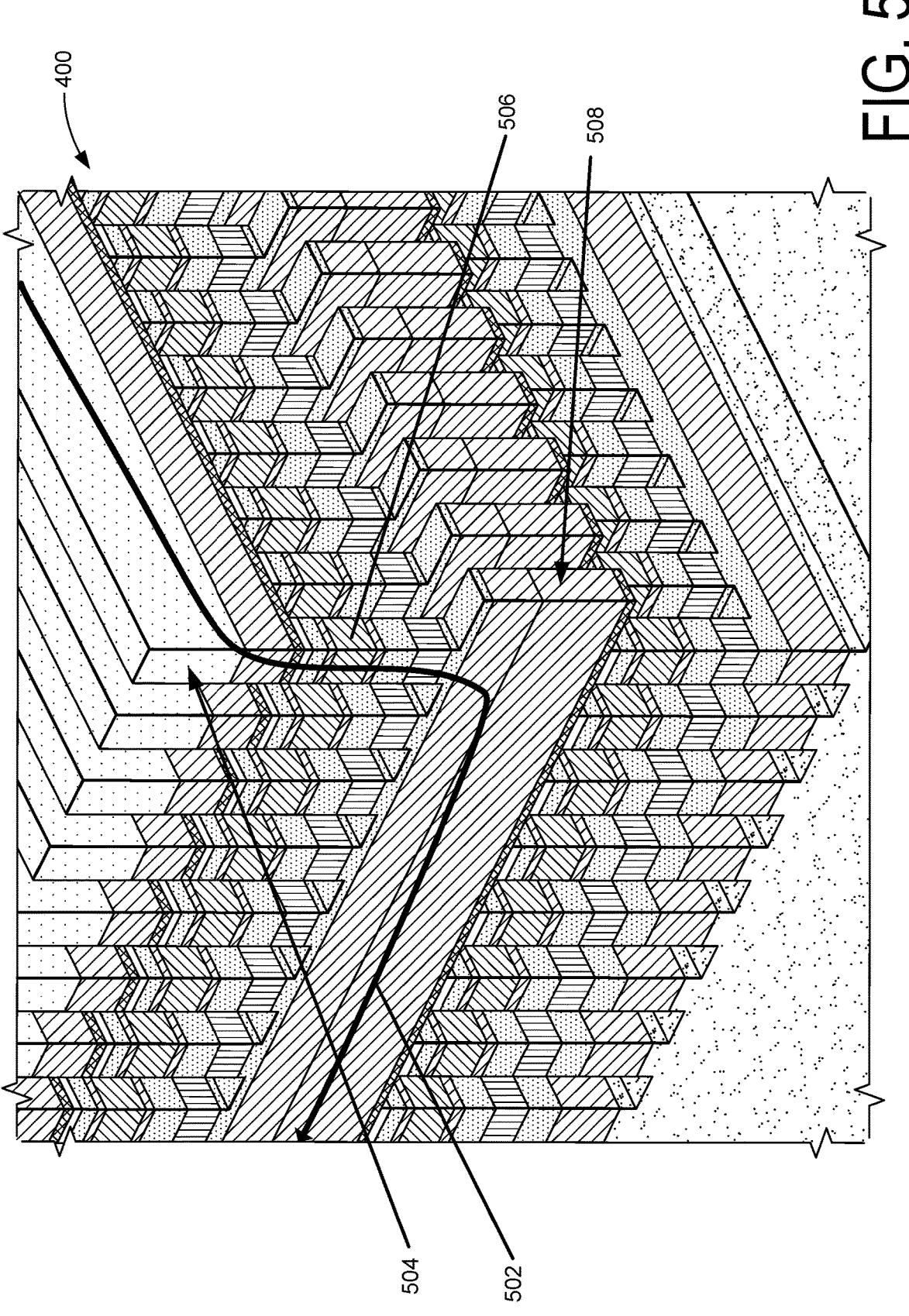
FIG. 5 is a perspective view of a current path through one component of the 3D crosspoint memory stack of FIG. 4.

Referring now to FIG. 5, the stack 400 is shown with a line depicting an electrical path 502 through which current will pass to perform an operation on a memory cell 506. As shown in the figure, the electrical path 502 passes through the bitline 504 corresponding to the memory cell 506, passes through the memory cell 506, then passes through the wordline 508 corresponding to the memory cell 506.

Figure 6:
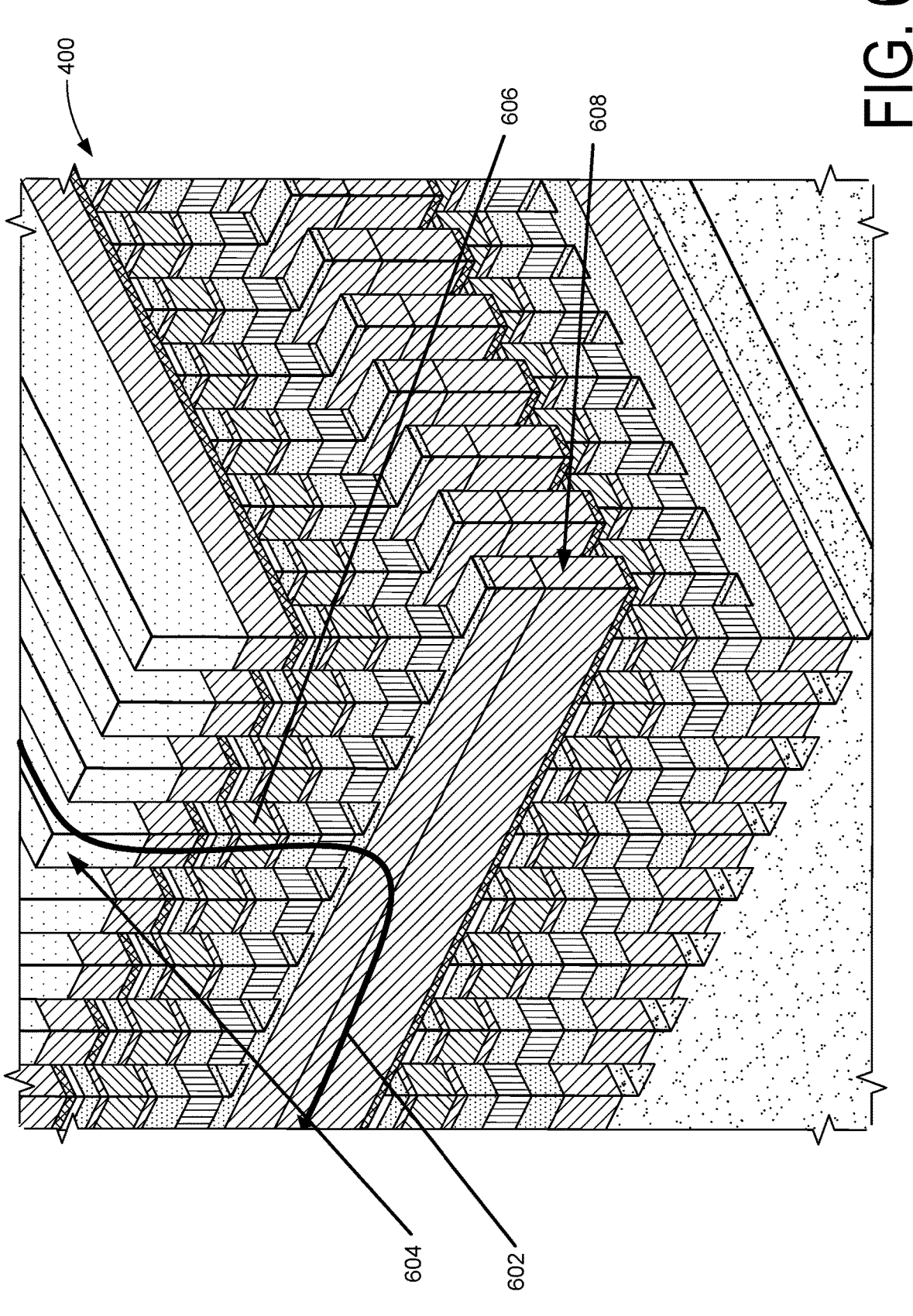
FIG. 6 is a perspective view of a current path through one component of the 3D crosspoint memory stack of FIG. 4.

Referring now to FIG. 6, the stack 400 is shown with a line depicting an electrical path 602 through which current will pass to perform an operation on a memory cell 606. As shown in the figure, the electrical path 602 passes through the bitline 604 corresponding to the memory cell 606, passes through the memory cell 606, then passes through the wordline 608 corresponding to the memory cell 606. It should be appreciated that the particular electrical path 602 depends on the memory cell 606 being selected. For example, the electrical path 602 for the memory cell 606 is different from the electrical path 502 for the memory cell 506 shown in FIG. 5. It should further be appreciated that various properties of the electrical path 502 may be different from that of the electrical path 602, such as the capacitance due to the wordline, the resistance due to the wordline, the capacitance due to the bitline, and the resistance due to the bitline.

Figure 7:
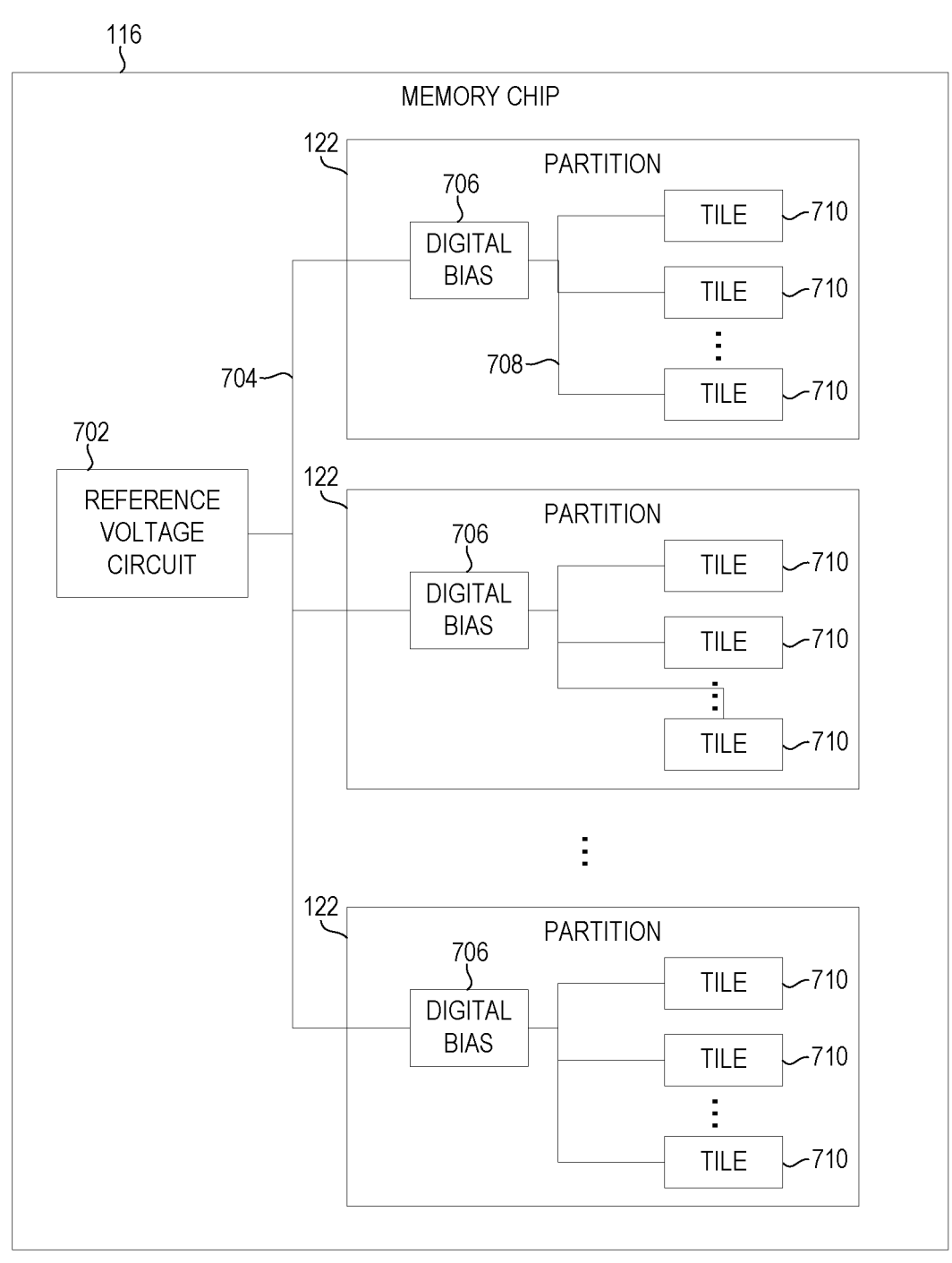
FIG. 7 illustrates a block diagram of an electrical path on a memory chip to a memory cell.

Referring now to FIG. 7, in one embodiment, a simplified diagram of a memory chip 116 shows the paths from a reference voltage circuit 702 that a voltage bias signal can take to a memory tile 710. Each memory tile 710 includes several memory cells. In the illustrative embodiment and as described in more detail below in regard to FIG. 8, the reference voltage circuit 702 provides a static voltage bias signal to each of several partitions 122 on the memory chip 116. On each partition 122, a digital bias 706 can dynamically adjust the voltage bias signal and provide the dynamic voltage bias signal to a memory tile 710, where it can be used for a memory operation. The dynamic bias provided by the digital bias 706 can depend on the particular electrical path taken to perform an operation on a particular memory cell.

Figure 8:
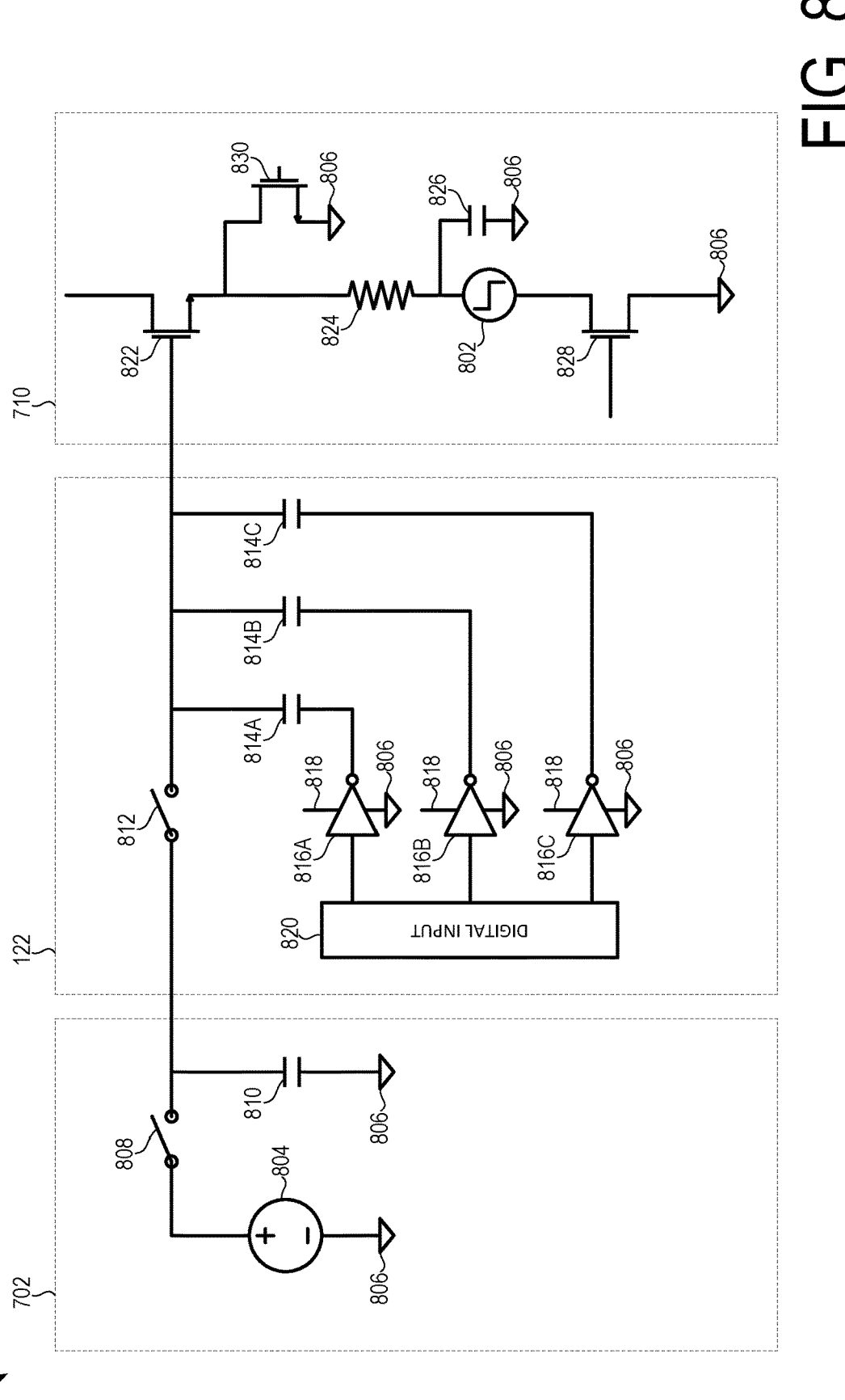
FIG. 8 illustrates a simplified circuit diagram of an electrical path through a memory cell.

Referring now to FIG. 8, in one embodiment, a simplified circuit 800 for performing operations on a memory cell 802 is illustrated. The circuit 800 includes a voltage source 804 that provides a static voltage source. The voltage source 804 is connected to a signal ground 806. The voltage source 804 is connected through a switch 808 to a capacitor 810. The voltage at the capacitor 810 is used to provide a static voltage bias signal from the reference voltage circuit 702 to the partitions 122. The components from the voltage source 804 to the capacitor 810 correspond to the reference voltage circuit 702. In the illustrative embodiment, each memory chip 116 has one reference voltage circuit 702 that can serve the entire memory chip 116.

The static voltage bias signal from the capacitor 810 is connected to each partition 122. The static voltage bias signal from the capacitor 810 charges a bank of capacitors 814A, 814B, 814C. The voltage bias signal is connected to a transistor 822, which is a source follower voltage source that controls the voltage on the wordline of the memory cell 802.

A digital output (such as from an inverting gate 816A, 816B, 816C) is connected to each capacitor 814A, 814B, 814C in the bank. The output of the gate 816A, 816B, 816C is a boost voltage 818. The boost voltage 818 may be any suitable voltage, such as any voltage from 0.01 to 1 volts. A digital input 820 controls the digital output of each gate 816A, 816B, 816C. In the illustrative embodiment, when the capacitor 810 is connected to the capacitors 814A, 814B, 814C, the side of each capacitor 814A, 814B, 814C not connected to the capacitor 810 is connected to ground (i.e., the output of the gate 816A, 816B, 816C is low). When the gates 816A, 816B, 816C are turned on, the voltage on the transistor 822 increases. Additionally or alternatively, in other embodiments, the side of some or all of capacitors 814A, 814B, 814C not connected to the capacitor 810 may be connected to the boost voltage 818, and some or all of the gates 816A, 816B, 816C may be used to lower the voltage on the transistor 822.

In the illustrative embodiment, the capacitance of each capacitor 814A, 814B, 814C in the bank is twice the capacitance of the capacitor before it. For example, if the capacitance of the first capacitor 814A is C, then the capacitance of the second capacitor 814B may be 2C and the capacitance of the third capacitor 814C may be 4C.

In the illustrative embodiment, the transistor 822 is used as a source follower, providing a voltage to the memory cell 802. A resistor 824 and capacitor 826 represent a parasitic capacitance and resistance in the electrical path from the source follower 822 to the memory cell 802. A switch 828 can be used to enable current to flow across the memory cell 802.

In use, when an operation is received for the memory cell 802, a switch 812 is opened, allowing the voltage bias signal to be disconnected from the capacitor 810. The voltage bias signal is maintained by the capacitors 814A, 814B, 814C, as well as any parasitic or other capacitance in the line. However, in some cases, the voltage bias signal may need to be increased in order to more quickly charge the capacitance of the wordline connected to the memory cell 802, depending on characteristics of the particular electrical path through the selected bitline and wordline corresponding to the memory cell 802. To increase the current voltage signal provided to the transistor 822, the output of the gates 816A, 816B, and/or 816C can be changed, increasing the voltage applied to the corresponding capacitor 814A, 814B, 814C, increasing the voltage applied to the transistor 822. The resulting bias voltage at the gate of the transistor 822 can be expressed by as:

$$V = V_{BASE} + V_{STEP},$$

$$V_{STEP} = V_{BOOST} \times \frac{C_{STEP}}{C_{TOTAL}},$$

where V is the voltage at the gate of the transistor 822, $V_{BASE}$ is the voltage at the gate of the transistor with the static voltage bias signal, $V_{STEP}$ is the additional voltage caused by the increase in the voltage bias signal, $V_{BOOST}$ is the boost voltage 818, $C_{STEP}$ is the total amount of capacitance of the capacitors whose voltage is being changed, and $C_{TOTAL}$ is the total capacitance connected to the gate of the transistor 822 (i.e., the sum of the capacitance of the bank of capacitors 814A, 814B, 814C as well as any parasitic or other capacitance). It should be appreciated that, as the capacitance of the capacitors 814B, 814C increase by a factor of two as compared to another capacitor, $C_{STEP}$, and therefore $C_{STEP}$, can be increased from 0 to 7C in increments of C, similar to counting in binary. In this way, the capacitors 814A, 814B, 814C act as a capacitive digital to analog converter (CDAC) of the digital input 820.

The total capacitance $C_{TOTAL}$ and the capacitance of the capacitors 814A, 814B, 814C may have any suitable value depending on the implementation of a particular circuit. In one embodiment, $C_{TOTAL}$ is about 40 picofarads, and the capacitance of the capacitors 814A, 814B, 814C is about 1, 2, and 4 picofarads, respectively. In other embodiments, $C_{TOTAL}$ may be, e.g., 10-200 picofarads, and the capacitance of the capacitors 814A, 814B, 814C may be, e.g., 0.1-50 picofarads.

In the illustrative embodiment, the bank of capacitors 814A, 814B, 814C includes three capacitors 814A, 814B, 814C. In other embodiments, the bank of capacitors may include any suitable number of capacitors, such as 1-8 capacitors. In the illustrative embodiment, the boost voltage 818 may be trimmed when the memory chip 116 is manufactured, compensating for any process variation.

In use, when a memory operation is received, a desired boost voltage is determined and applied while the wordline charges. After a predetermined amount of time, the boost voltage can be dropped, and the voltage across the memory cell 802 will be approximately the demarcation voltage. As used herein, the demarcation voltage refers to a voltage level at which set cells will threshold and snap back to a low-resistance state and reset cells will not threshold. In some embodiments, after another predetermined amount of time, the bias voltage on the transistor 822 is dropped slightly in order to lower the voltage across the memory cell 802 below the demarcation voltage, preventing any changes in the resistance of the memory cell 802 while the state of the memory cell 802 is being read. In such embodiments, the digital input 820 may be used to control the voltage at the gate of the transistor 822 to several different levels: a first value to rapidly charge up the wordline, a second value to apply a demarcation voltage across the memory cell 802, and a third value to slightly lower the voltage across the memory cell 802 while it is being read. When the voltage across the memory cell 802 is to be lowered, in the illustrative embodiment, a current mirror 830 may be activated to bleed current from the wordline.

In the embodiment shown, the reference voltage source 702 and capacitors 814A, 814B, 814C are connected to a transistor 822 that acts as a voltage source for the wordline connected to the memory cell 802. Additionally or alternatively, in some embodiments, the reference voltage source 702 and capacitors 814A, 814B, 814C may be connected to a transistor that acts as a voltage source for a bitline connected to the memory cell 802. In a similar manner as the transistor 830, a transistor may be used to bleed current from the bitline.

Figure 9:
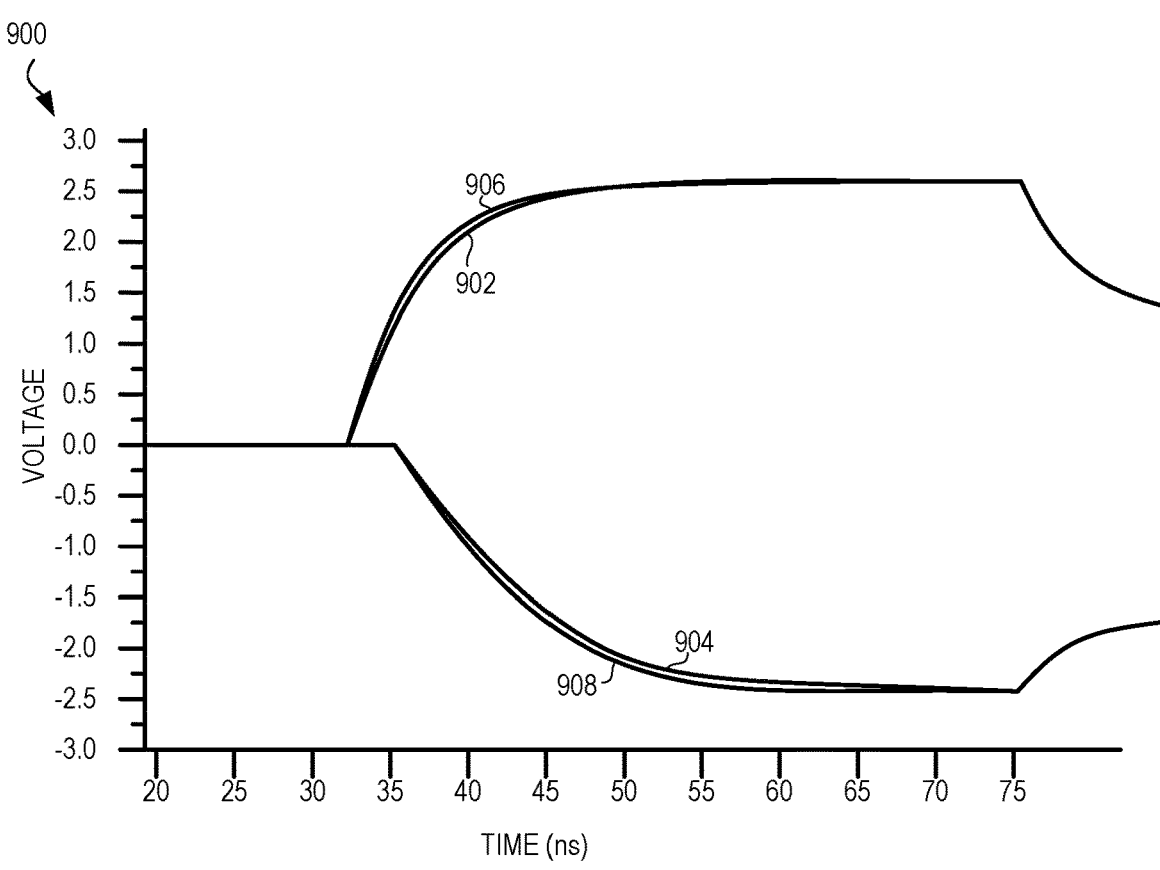
FIG. 9 illustrates a graph showing voltage as a function of time on a word line and a bit line in various embodiments.

Referring now to FIG. 9-12, in one embodiment, certain parameters such as the voltage at certain locations are compared with and without overdriving the source follower 822 on the wordline (and/or overdriving the source follower on the bitline). In FIG. 9, in one embodiment, a plot 900 shows a simulation of the voltage on a wordline and bitline of a memory cell 802 over time. Line 902 corresponds to the voltage on the wordline by a source follower 822 in an embodiment without overdriving the source follower 822. Line 904 corresponds to the voltage on the bitline by a source follower in an embodiment without overdriving the source follower. Line 906 corresponds to the voltage on the wordline by a source follower 822 in an embodiment that overdrives the source follower 822. Line 908 corresponds to the voltage on the bitline by a source follower in an embodiment that overdrives the source follower.

Figure 10:
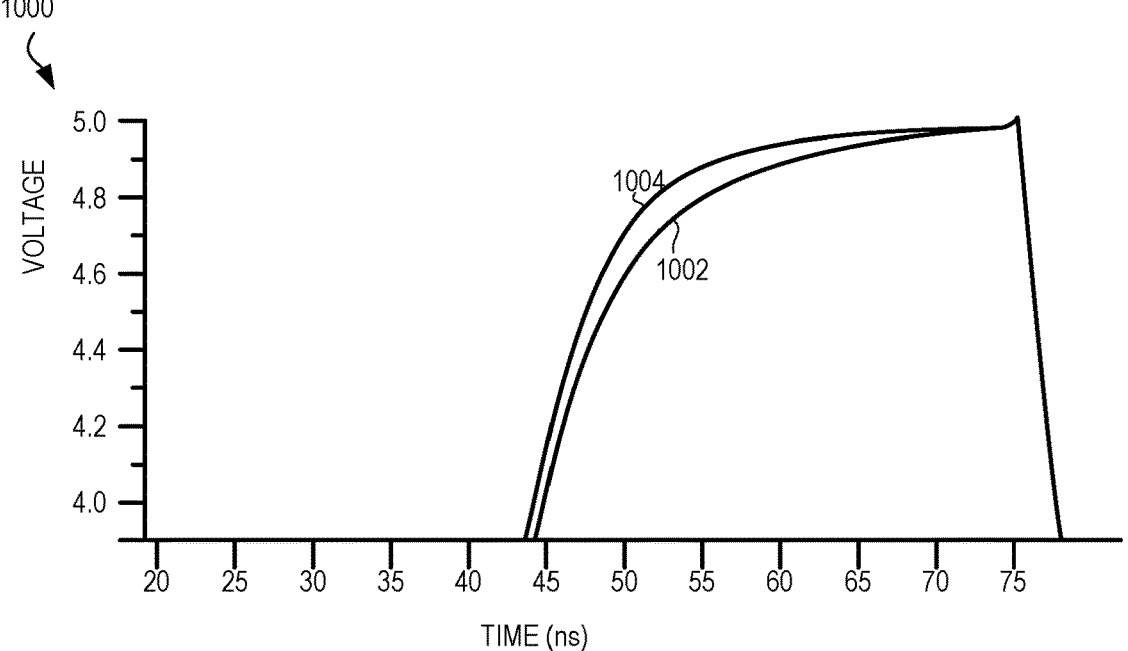
FIG. 10 illustrates a graph showing voltage as a function of time across a memory cell in various embodiments.

Referring now to FIG. 10, in one embodiment, a plot 1000 shows a simulation of the voltage across a memory cell 802 as a function of time. Line 1002 corresponds to the voltage across the memory cell 802 without overdriving the source follower 822, and line 1004 corresponds to the voltage across the memory cell 802 with overdriving the source follower 822. At, e.g., about 57 nanoseconds, the line 1004 indicates a voltage about 72 millivolts higher than that of line 1002, a voltage that line 1002 does not reach for 5.5 more nanoseconds. In general, overdriving the source follower 822 (and/or overdriving the source follower on the bitline) can increase the voltage across the memory cell 802 at a target time by, e.g., 50-100 millivolts. Similarly, overdriving the source follower 822 (and/or overdriving the source follower on the bitline) can allow for reaching a target voltage earlier by, e.g., 2-10 nanoseconds.

Figure 11:
FIG. 11 illustrates a graph showing voltage as a function of time on a gate of a bitline source follower in various embodiments.
Figure 11:
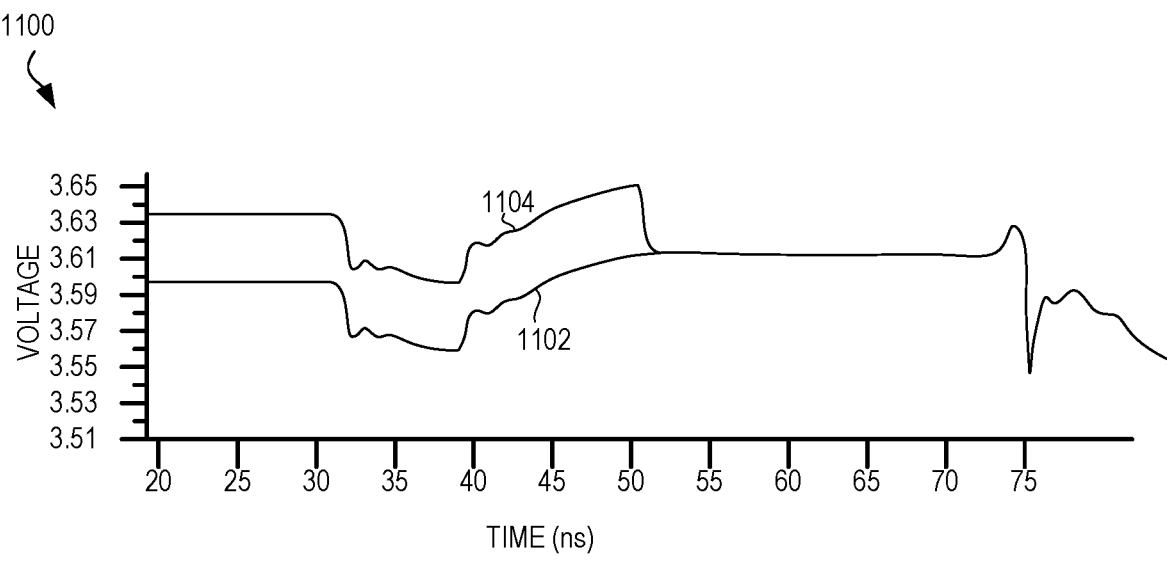
Figure 12:
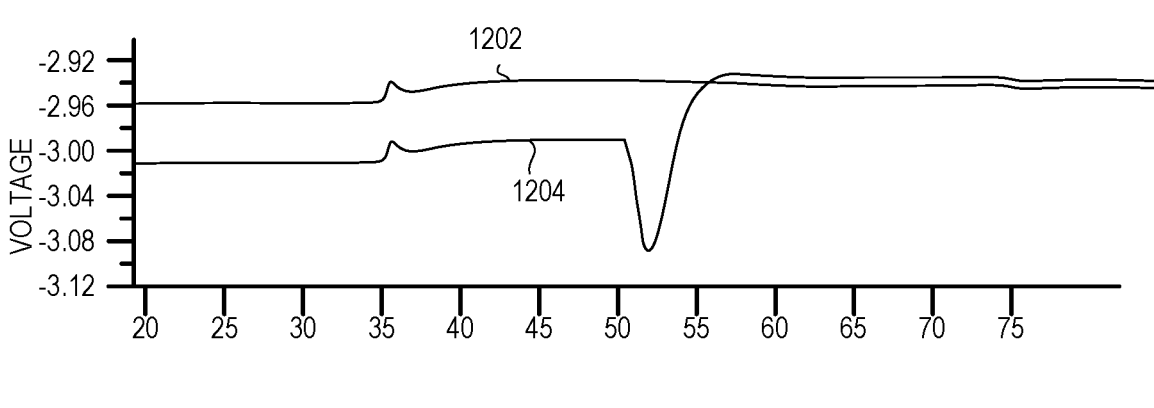
FIG. 12 illustrates a graph showing voltage as a function of time on a gate of a wordline source follower in various embodiments.

Referring now to FIGS. 11 and 12, in one embodiment, a plot 1100 shows a plot of the voltage of the gate of the source follower 822 of the wordline, and a plot 1200 shows a plot of the voltage of the gate of the source follower on the bitline. Line 1102 shows the voltage of the gate of the source follower 822 without overdriving the source follower 822, and line 1104 shows the voltage of the gate of the source follower 822 with overdriving the source follower 822. Line 1202 shows the voltage of the gate of the source follower without overdriving the source follower, and line 1204 shows the voltage of the gate of the source follower with overdriving the source follower. In the embodiment depicted, the gate of the source follower 822 of the wordline is overdriven by about 40 millivolts for about 20 nanoseconds. More generally, the gate of the source follower 822 of the wordline may be overdriven by, e.g., 10-100 millivolts for, e.g., 5-30 nanoseconds. In the embodiment depicted, the gate of the source follower of the bitline is overdriven by about 50 millivolts for about 20 nanoseconds. More generally, the gate of the source follower of the bitline may be overdriven by, e.g., 10-100 millivolts for, e.g., 5-30 nanoseconds.

Figures 13, 14, 15:
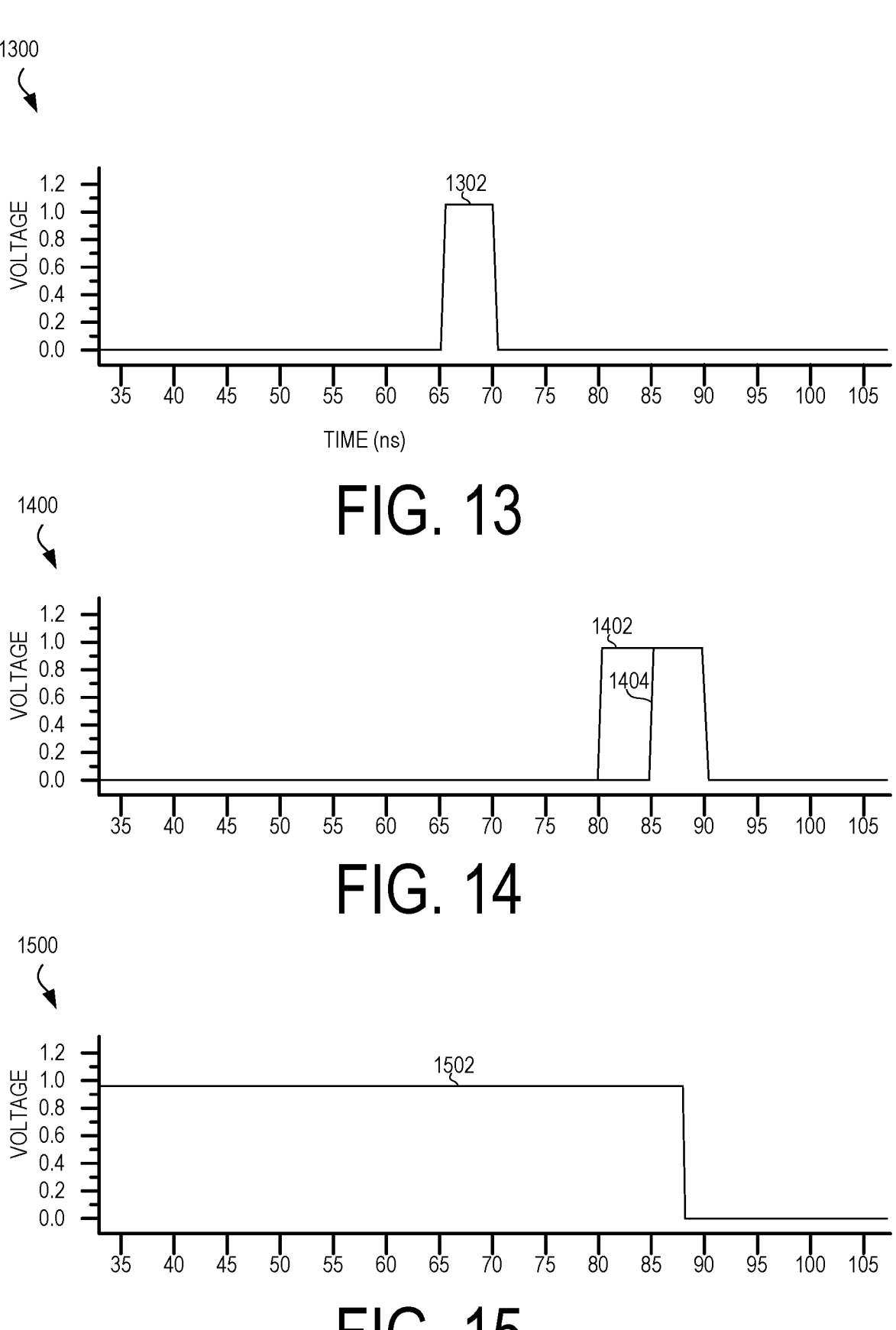
FIG. 13 illustrates a graph showing voltage as a function of time on a bleeder enable circuit in one embodiment.
FIG. 14 illustrates a graph showing voltage as a function of time on a sense enable/latch circuit in one embodiment.
FIG. 15 illustrates a graph showing voltage as a function of time on a sense circuit in one embodiment.

Referring now to FIGS. 13-17, in one embodiment, certain parameters such as the voltage at certain locations are shown when the bias voltage on the source follower 822 is reduced and charge on the wordline is bled off. In FIG. 13, in one embodiment, a plot 1300 shows a simulation of the voltage on a bleeder enable circuit as shown by line 1302, enabling the bleed current mirror 830. In FIG. 14, in one embodiment, a plot 1400 shows a line 1402 corresponding to voltage on a sense enable circuit and a line 1404 corresponding to a voltage on a sense latch enable circuit. In FIG. 15, in one embodiment, a plot 1500 shows a line 1502 corresponding to a sense data.

Figure 16:
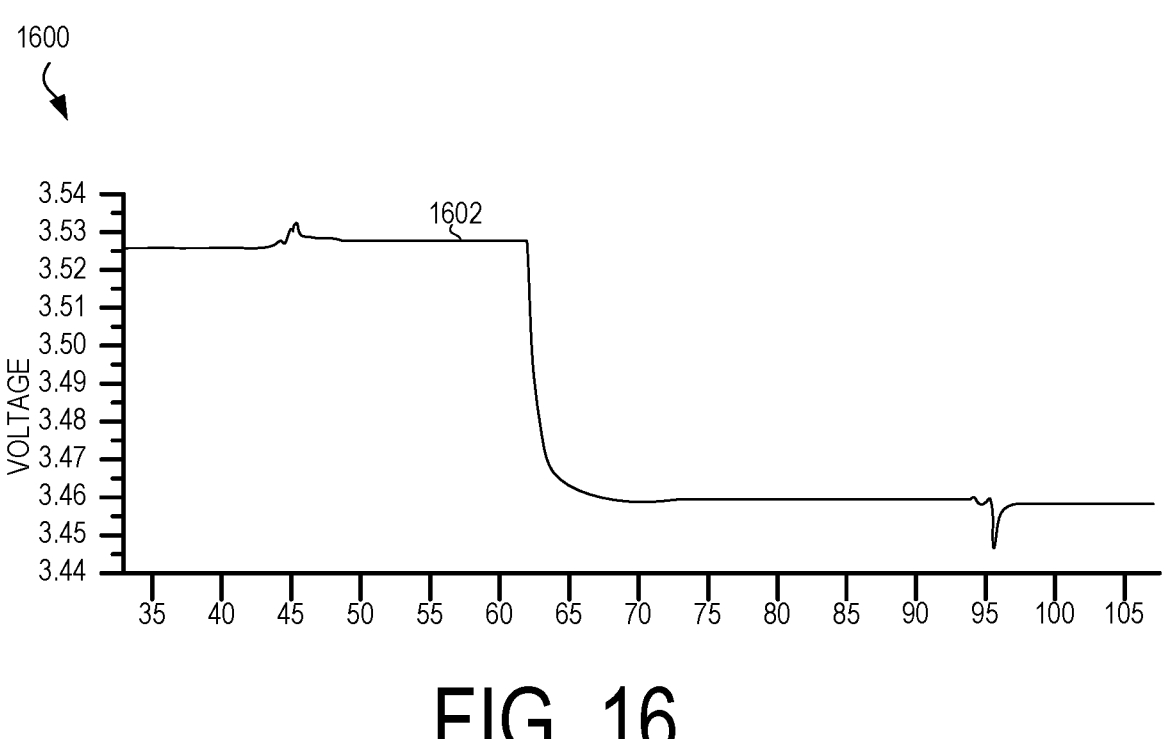
FIG. 16 illustrates a graph showing voltage as a function of time on a gate of a bitline source follower in one embodiment.
Figure 17:
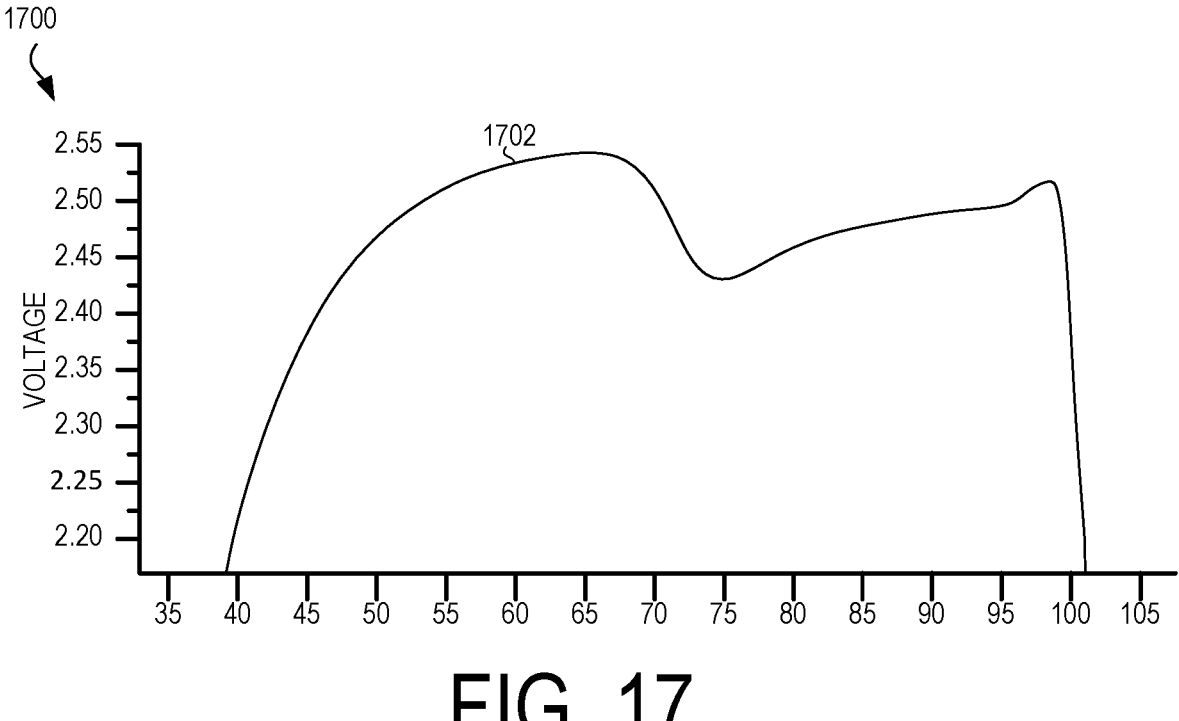
FIG. 17 illustrates a graph showing a voltage as a function of time across a memory cell in one embodiment.

Referring now to FIG. 16, in one embodiment, a plot 1600 shows a line 1602 representing voltage on the gate of the source follower 822 as a function of time. In FIG. 17, in one embodiment, a plot 1700 shows a line 1702 corresponding to the voltage across the memory cell 802 as a function of time. As the bias on the source follower 822 is reduced and the bleed current mirror 830 is enabled, the voltage across the memory cell 802 drops.

Referring now to FIG. 18, in use, a system 100 may perform a method 1800 for controlling dynamic biasing of memory cells. In some embodiments, some or all of the method 1800 may be performed by, e.g., the chip controller 126 or other control circuitry. The method 1800 begins in block 1802, in which the control circuitry receives an instruction to perform an operation on a memory cell, such as the memory cell 802. The control circuitry may, e.g., receive an instruction to perform an operation from a storage device controller 118, from a CPU memory controller 112, from a processor 108, from an I/O controller 110, and/or from any other suitable source. The instruction may be to read, write, set, or reset the memory cell 802.

In block 1804, the control circuitry may determine properties of the electrical path going through the selected memory cell 802. The control circuitry 312 may determine the bitline and the wordline in block 1806, and use known properties of the bitline and wordline to determine the capacitance of the electrical path in block 1808 and the resistance of the electrical path in block 1810. The control circuitry may determine those values in any suitable manner, such as by calculating them based on the dimensions of the bitline and wordline, by looking them up in a table or database, etc. In some embodiments, the control circuitry may determine one or more parameters that are directly or indirectly indicative of properties of the electrical path through the selected memory cell 802. For example, the control circuitry may not directly determine the properties of the electrical path (such as capacitance and/or resistance) but rather may simply determine the current needed to perform the selected operation on the selected memory cell 802. For example, the control circuitry may apply a formula, check a database, etc., based on the selected memory cell 802 and the corresponding bitline and wordline to determine one or more parameters indicative of one or more properties of the electrical path through the memory cell that can be used for controlling the digital input 836. In one embodiment, the control circuitry may determine an amount of charge to supply by multiplying a length of the electrical path of the bitline by a first predetermined constant, then adding a length of the electrical path of the wordline multiplied by a second predetermined constant.

In block 1812, the control circuitry determines the digital input to the capacitive digital-to-analog converter (CDAC) based on the memory cell 802, such as by determining the additional amount of $V_{STEP}$ needed in addition to the base voltage $V_{BASE}$ based on the electrical path through the memory cell 802 or other properties determined in block 1804. Additionally or alternatively, the control circuitry may determine the digital input to the CDAC based on a measured drift or based on an amount of cycles of the memory cell 802.

In block 1814, the switch 812 is opened. In block 1816, the boost voltage is applied to select capacitors 814A, 814B, 814C, increasing the voltage bias signal by a digitally-controlled amount.

In block 1818, after the wordline is charged with the boosted voltage, the bias voltage is reduced. In some embodiments, the bias voltage is reduced so that the memory cell 802 has a demarcation voltage across it. In other embodiments, either when the boosted voltage is removed or after a predetermined amount of time has passed, the bias voltage is reduced so that the memory cell 802 has less than the demarcation voltage on it, preventing the resistance of the memory cell 802 changing while the current through it is read.

In block 1820, in embodiments in which the voltage on the wordline is reduced, current is bled from the wordline by activating the current mirror 830.

In block 1822, the state of the memory cell 802 is determined by measuring the current through the memory cell 802. In block 1824, if there is any remaining boost voltage, the boost voltage is removed from the capacitors 824A, 824B, 824C. In block 1826, the hold switch 812 is closed. The method 1800 then returns to block 1802 to wait for another memory operation.

In the embodiment described above, the operation is a memory read operation. In such an operation, the voltage may be bled off in order to prevent a change in the resistance of the memory cell 802 while it is being read. In other embodiments, the memory operation may be a set or reset operation. In such embodiments, there may be no need to bleed off the voltage. However, the boost voltage may be used to more quickly reach a target voltage to set or reset the memory cell 802.

EXAMPLES

Illustrative examples of the technologies disclosed herein are provided below. An embodiment of the technologies may include any one or more, and any combination of, the examples described below.

Example 1 includes an apparatus for dynamic biasing of memory cells, the apparatus comprising a plurality of three-dimensional crosspoint memory cells; and control circuitry to receive a memory operation for a memory cell of the plurality of three-dimensional crosspoint memory cells; provide, during the memory operation, a first gate bias signal for a source follower for a first amount of time; and provide, during the memory operation, a second gate bias signal for the source follower for a second amount of time, wherein the second gate bias signal is different from the first gate bias signal and the second amount of time is different from the first amount of time.

Example 2 includes the subject matter of Example 1, and wherein the first gate bias signal is higher than the second gate bias signal, wherein the first amount of time is before the second amount of time.

Example 3 includes the subject matter of any of Examples 1 and 2, and wherein the source follower is to charge a wordline of the memory cell during the first amount of time.

Example 4 includes the subject matter of any of Examples 1-3, and wherein the control circuitry is to control a voltage across the memory cell to be less than a demarcation voltage during the second amount of time.

Example 5 includes the subject matter of any of Examples 1-4, and wherein the control circuitry is to activate a current mirror to bleed off charge from the wordline during at least part of the second amount of time.

Example 6 includes the subject matter of any of Examples 1-5, and wherein the first gate bias signal is above a gate bias signal corresponding to a demarcation voltage across the memory cell.

Example 7 includes the subject matter of any of Examples 1-6, and wherein the second gate bias signal is below a gate bias signal corresponding to a demarcation voltage across the memory cell.

Example 8 includes the subject matter of any of Examples 1-7, and wherein the memory operation is indicative of a wordline address and a bitline address of the memory cell, wherein the control circuitry is to determine the first gate bias signal to provide based on the wordline address and the bitline address.

Example 9 includes the subject matter of any of Examples 1-8, and wherein to provide the first gate bias signal comprises to provide a first set of one or more digital inputs to a capacitive digital-to-analog converter.

Example 10 includes the subject matter of any of Examples 1-9, and wherein to provide the second gate bias signal comprises to provide a second set of one or more digital inputs to the capacitive digital-to-analog converter, wherein the second set of one or more digital inputs is different from the first set of one or more digital inputs.

Example 11 includes the subject matter of any of Examples 1-10, and wherein the source follower is connected a wordline of the memory cell, wherein the control circuitry is further to provide, during the memory operation, a third gate bias signal for a second source follower for a third amount of time, wherein the second source follower is connected to a bitline of the memory cell; and provide, during the memory operation, a fourth gate bias signal for the second source follower for a fourth amount of time of the memory operation, wherein the third gate bias signal is different from the fourth gate bias signal and the fourth amount of time is different from the third amount of time, wherein the third amount of time overlaps with the first amount of time and the fourth amount of time overlaps with the third amount of time.

Example 12 includes a memory die comprising a plurality of three-dimensional crosspoint memory cells; a wordline connected to the plurality of three-dimensional crosspoint memory cells; and a current mirror connected to the wordline to bleed charge from the wordline.

Example 13 includes an apparatus comprising the memory die of Example 12, the apparatus further comprising control circuitry to receive a memory operation for a memory cell of the plurality of three-dimensional crosspoint memory cells; and provide, during the memory operation, a signal to the current mirror to bleed charge from the wordline.

Example 14 includes the subject matter of Example 13, and wherein the control circuitry is to provide, during the memory operation, a first gate bias signal for a source follower to charge the wordline; and provide, during the memory operation, a second gate bias signal for the source follower lower than the first gate bias signal while the current mirror is to bleed charge from the wordline.

Example 15 includes the subject matter of any of Examples 13 and 14, and wherein the control circuitry is to control the source follower and the current mirror to cause a voltage across the memory cell to decrease from above a demarcation voltage to less than the demarcation voltage during at least part of the memory operation.

Example 16 includes the subject matter of any of Examples 13-15, and wherein to provide the first gate bias signal comprises to provide a first set of one or more digital inputs to a capacitive digital-to-analog converter.

Example 17 includes the subject matter of any of Examples 13-16, and wherein to provide the second gate bias signal comprises to provide a second set of one or more digital inputs to the capacitive digital-to-analog converter, wherein the second set of one or more digital inputs is different from the first set of one or more digital inputs.

Example 18 includes a method comprising receiving, by control circuitry, a memory operation to be performed on a memory cell of a plurality of three-dimensional crosspoint memory cells; providing, during the memory operation and by the control circuitry, a first gate bias signal for a source follower connected to a wordline of the memory cell for a first amount of time; and providing, during the memory operation and by the control circuitry, a second gate bias signal for the source follower for a second amount of time, wherein the second gate bias signal is different from the first gate bias signal and the second amount of time is different from the first amount of time.

Example 19 includes the subject matter of Example 18, and wherein the first gate bias signal is higher than the second gate bias signal, wherein the first amount of time is before the second amount of time.

Example 20 includes the subject matter of any of Examples 18 and 19, and wherein the source follower is to charge the wordline of the memory cell during the first amount of time.

Example 21 includes the subject matter of any of Examples 18-20, and wherein the control circuitry is to control a voltage across the memory cell to be less than a demarcation voltage during the second amount of time.

Example 22 includes the subject matter of any of Examples 18-21, and wherein the control circuitry is to activate a current mirror to bleed off charge from the wordline during at least part of the second amount of time.

Example 23 includes the subject matter of any of Examples 18-22, and wherein the first gate bias signal is above a gate bias signal corresponding to a demarcation voltage across the memory cell.

Example 24 includes the subject matter of any of Examples 18-23, and wherein the second gate bias signal is below a gate bias signal corresponding to a demarcation voltage across the memory cell.

Example 25 includes the subject matter of any of Examples 18-24, and wherein the memory operation is indicative of a wordline address and a bitline address of the memory cell, wherein the control circuitry is to determine the first gate bias signal to provide based on the wordline address and the bitline address.

Example 26 includes the subject matter of any of Examples 18-25, and wherein providing the first gate bias signal comprises providing a first set of one or more digital inputs to a capacitive digital-to-analog converter.

Example 27 includes the subject matter of any of Examples 18-26, and wherein providing the second gate bias signal comprises providing a second set of one or more digital inputs to the capacitive digital-to-analog converter, wherein the second set of one or more digital inputs is different from the first set of one or more digital inputs.

Example 28 includes the subject matter of any of Examples 18-27, and wherein the source follower is connected the wordline of the memory cell, wherein the method further comprises providing, during the memory operation and by the control circuitry, a third gate bias signal for a second source follower for a third amount of time, wherein the second source follower is connected to a bitline of the memory cell; and providing, during the memory operation and by the control circuitry, a fourth gate bias signal for the second source follower for a fourth amount of time of the memory operation, wherein the third gate bias signal is different from the fourth gate bias signal and the fourth amount of time is different from the third amount of time, wherein the third amount of time overlaps with the first amount of time and the fourth amount of time overlaps with the third amount of time.

Example 29 includes an apparatus for dynamic biasing of memory cells, the apparatus comprising means for receiving a memory operation to be performed on a memory cell of a plurality of three-dimensional crosspoint memory cells; means for providing, during the memory operation, a first gate bias signal for a source follower connected to a wordline of the memory cell for a first amount of time; and means for providing, during the memory operation, a second gate bias signal for the source follower for a second amount of time, wherein the second gate bias signal is different from the first gate bias signal and the second amount of time is different from the first amount of time.

Example 30 includes the subject matter of Example 29, and wherein the first gate bias signal is higher than the second gate bias signal, wherein the first amount of time is before the second amount of time.

Example 31 includes the subject matter of any of Examples 29 and 30, and wherein the source follower is to charge the wordline of the memory cell during the first amount of time.

Example 32 includes the subject matter of any of Examples 29-31, and wherein control circuitry is to control a voltage across the memory cell to be less than a demarcation voltage during the second amount of time.

Example 33 includes the subject matter of any of Examples 29-32, and wherein the control circuitry is to activate a current mirror to bleed off charge from the wordline during at least part of the second amount of time.

Example 34 includes the subject matter of any of Examples 29-33, and wherein the first gate bias signal is above a gate bias signal corresponding to a demarcation voltage across the memory cell.

Example 35 includes the subject matter of any of Examples 29-34, and wherein the second gate bias signal is below a gate bias signal corresponding to a demarcation voltage across the memory cell.

Example 36 includes the subject matter of any of Examples 29-35, and wherein the memory operation is indicative of a wordline address and a bitline address of the memory cell, wherein control circuitry is to determine the first gate bias signal to provide based on the wordline address and the bitline address.

Example 37 includes the subject matter of any of Examples 29-36, and wherein the means for providing the first gate bias signal comprises means for providing a first set of one or more digital inputs to a capacitive digital-to-analog converter.

Example 38 includes the subject matter of any of Examples 29-37, and wherein the means for providing the second gate bias signal comprises means for providing a second set of one or more digital inputs to the capacitive digital-to-analog converter, wherein the second set of one or more digital inputs is different from the first set of one or more digital inputs.

Example 39 includes the subject matter of any of Examples 29-38, and wherein the source follower is connected the wordline of the memory cell, wherein the method further comprises means for providing, during the memory operation, a third gate bias signal for a second source follower for a third amount of time, wherein the second source follower is connected to a bitline of the memory cell; and means for providing, during the memory operation, a fourth gate bias signal for the second source follower for a fourth amount of time of the memory operation, wherein the third gate bias signal is different from the fourth gate bias signal and the fourth amount of time is different from the third amount of time, wherein the third amount of time overlaps with the first amount of time and the fourth amount of time overlaps with the third amount of time.

The invention claimed is:

1. An apparatus for dynamic biasing of memory cells, the apparatus comprising:
a plurality of three-dimensional crosspoint memory cells; and
control circuitry to:
receive a memory operation for a memory cell of the plurality of three-dimensional crosspoint memory cells;
provide, during the memory operation, a first gate bias signal for a source follower for a first amount of time; and
provide, during the memory operation, a second gate bias signal for the source follower for a second amount of time, wherein the second gate bias signal is different from the first gate bias signal and the second amount of time is different from the first amount of time,
wherein the first gate bias signal biases the source follower in an active region of the source follower, wherein the second gate bias signal biases the source follower in the active region of the source follower.

2. The apparatus of claim 1, wherein the first gate bias signal is higher than the second gate bias signal, wherein the first amount of time is before the second amount of time.

3. The apparatus of claim 2, wherein the source follower is to charge a wordline of the memory cell during the first amount of time.

4. The apparatus of claim 3, wherein the control circuitry is to control a voltage across the memory cell to be less than a demarcation voltage during the second amount of time.

5. The apparatus of claim 4, wherein the control circuitry is to activate a current mirror to bleed off charge from the wordline during at least part of the second amount of time.

6. The apparatus of claim 2, wherein the first gate bias signal is above a gate bias signal corresponding to a demarcation voltage across the memory cell.

7. The apparatus of claim 2, wherein the second gate bias signal is below a gate bias signal corresponding to a demarcation voltage across the memory cell.

8. The apparatus of claim 1, wherein the memory operation is indicative of a wordline address and a bitline address of the memory cell, wherein the control circuitry is to determine the first gate bias signal to provide based on the wordline address and the bitline address.

9. The apparatus of claim 1, wherein to provide the first gate bias signal comprises to provide a first set of one or more digital inputs to a capacitive digital-to-analog converter.

10. The apparatus of claim 9, wherein to provide the second gate bias signal comprises to provide a second set of one or more digital inputs to the capacitive digital-to-analog converter, wherein the second set of one or more digital inputs is different from the first set of one or more digital inputs.

11. The apparatus of claim 1, wherein the source follower is connected a wordline of the memory cell, wherein the control circuitry is further to:

provide, during the memory operation, a third gate bias signal for a second source follower for a third amount of time, wherein the second source follower is connected to a bitline of the memory cell; and provide, during the memory operation, a fourth gate bias signal for the second source follower for a fourth amount of time of the memory operation, wherein the third gate bias signal is different from the fourth gate bias signal and the fourth amount of time is different from the third amount of time, wherein the third amount of time overlaps with the first amount of time and the fourth amount of time overlaps with the third amount of time.

12. The apparatus of claim 1, wherein during the first amount of time the source follower is biased to raise a potential of a selected access line toward a target level, and during the second amount of time the source follower is biased to maintain a voltage across the memory cell at or below a demarcation voltage while the memory cell is sensed.

13. An apparatus comprising:

a memory die comprising:

a plurality of three-dimensional crosspoint memory cells;

a wordline connected to the plurality of three-dimensional crosspoint memory cells; and a current mirror connected to the wordline to bleed charge from the wordline to reduce a voltage across a memory cell of the plurality of three-dimensional crosspoint memory cells during a memory operation; and control circuitry to:

receive the memory operation for the memory cell of the plurality of three-dimensional crosspoint memory cells;

provide, during the memory operation, a first gate bias signal for a source follower to charge the wordline;

provide, during the memory operation, a signal to the current mirror to bleed charge from the wordline; and provide, during the memory operation, a second gate bias signal for the source follower lower than the first gate bias signal while the current mirror is to bleed charge from the wordline, wherein to provide the first gate bias signal comprises to provide a first set of one or more digital inputs to a capacitive digital-to-analog converter.

14. A method comprising:

receiving, by control circuitry, a memory operation to be performed on a memory cell of a plurality of three-dimensional crosspoint memory cells;

providing, during the memory operation and by the control circuitry, a first gate bias signal for a source follower connected to a wordline of the memory cell for a first amount of time; and providing, during the memory operation and by the control circuitry, a second gate bias signal for the source follower for a second amount of time, wherein the second gate bias signal is different from the first gate bias signal and the second amount of time is different from the first amount of time, wherein the first gate bias signal biases the source follower in an active region of the source follower, wherein the second gate bias signal biases the source follower in the active region of the source follower.

15. The method of claim 14, wherein the memory operation is indicative of a wordline address and a bitline address of the memory cell, wherein the control circuitry is to determine the first gate bias signal to provide based on the wordline address and the bitline address.

16. The method of claim 14, wherein providing the first gate bias signal comprises providing a first set of one or more digital inputs to a capacitive digital-to-analog converter.

* * * * *